United States Patent
Riess et al.

(10) Patent No.: US 8,901,624 B2
(45) Date of Patent: Dec. 2, 2014

(54) SCHOTTKY DIODES HAVING METAL GATE ELECTRODES AND METHODS OF FORMATION THEREOF

(71) Applicant: Infineon Technologies AG, Neubiberg (DE)

(72) Inventors: Philipp Riess, Munich (DE); Domagoj Siprak, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/952,434

(22) Filed: Jul. 26, 2013

(65) Prior Publication Data

US 2013/0307091 A1    Nov. 21, 2013

Related U.S. Application Data

(62) Division of application No. 13/082,793, filed on Apr. 8, 2011, now Pat. No. 8,518,811.

(51) Int. Cl.
| | | |
|---|---|---|
| *H01L 29/872* | (2006.01) | |
| *H01L 29/66* | (2006.01) | |
| *H01L 27/095* | (2006.01) | |
| *H01L 29/78* | (2006.01) | |
| *H01L 27/06* | (2006.01) | |
| *H01L 23/48* | (2006.01) | |
| *H01L 29/06* | (2006.01) | |
| *H01L 29/49* | (2006.01) | |
| *H01L 29/51* | (2006.01) | |
| *H01L 29/93* | (2006.01) | |
| *H01L 21/8234* | (2006.01) | |

(52) U.S. Cl.
CPC ............ *H01L 29/78* (2013.01); *H01L 29/6659* (2013.01); *H01L 27/095* (2013.01); *H01L 29/872* (2013.01); *H01L 29/7845* (2013.01); *H01L 29/4966* (2013.01); *H01L 27/0629* (2013.01); *H01L 29/517* (2013.01); *H01L 29/66545* (2013.01); *H01L 29/93* (2013.01); *H01L 29/7833* (2013.01); *H01L 23/48* (2013.01); *H01L 29/7843* (2013.01); *H01L 29/0692* (2013.01); *H01L 21/823437* (2013.01)
USPC .......................................................... 257/267

(58) Field of Classification Search
CPC ............ H01L 21/0435; H01L 21/0495; H01L 29/0619; H01L 29/6659; H01L 27/095
USPC .......................... 257/109, 409, 411–412, 267
See application file for complete search history.

(56) References Cited

U.S. PATENT DOCUMENTS

| | | |
|---|---|---|
| 4,835,580 A | 5/1989 | Havemann et al. |
| 5,324,965 A | 6/1994 | Tompsett et al. |
| 5,583,348 A | 12/1996 | Sundaram |
| 5,629,544 A | 5/1997 | Voldman et al. |
| 5,696,389 A | 12/1997 | Ishikawa et al. |
| 5,814,832 A | 9/1998 | Takeda et al. |

(Continued)

*Primary Examiner* — Nathan Ha
(74) *Attorney, Agent, or Firm* — Slater & Matsil, L.L.P.

(57) ABSTRACT

In one embodiment, the semiconductor device includes a first doped region disposed in a first region of a substrate. A first metal electrode having a first portion of a metal layer is disposed over and contacts the first doped region. A second doped region is disposed in a second region of the substrate. A dielectric layer is disposed on the second doped region. A second metal electrode having a second portion of the metal layer is disposed over the dielectric layer. The second metal electrode is capacitively coupled to the second doped region.

22 Claims, 18 Drawing Sheets

(56) References Cited

U.S. PATENT DOCUMENTS

| | | | |
|---|---|---|---|
| 5,843,796 A | 12/1998 | Disney | |
| 5,915,179 A * | 6/1999 | Etou et al. | 438/268 |
| 5,918,123 A | 6/1999 | Yang | |
| 6,186,408 B1 * | 2/2001 | Rodov et al. | 238/268 |
| 6,455,403 B1 | 9/2002 | Hwang et al. | |
| 6,498,367 B1 * | 12/2002 | Chang et al. | 257/341 |
| 6,544,674 B2 * | 4/2003 | Tuller et al. | 428/698 |
| 6,791,154 B2 | 9/2004 | Matsumoto et al. | |
| 6,855,999 B2 | 2/2005 | Hwang et al. | |
| 6,885,077 B2 | 4/2005 | Dietl et al. | |
| 6,998,694 B2 | 2/2006 | Wu | |
| 7,166,894 B2 * | 1/2007 | Templier et al. | 257/347 |
| 7,288,446 B2 | 10/2007 | Hovel et al. | |
| 7,335,927 B2 | 2/2008 | Coolbaugh et al. | |
| 7,538,352 B2 | 5/2009 | Fukuda et al. | |
| 7,719,091 B2 * | 5/2010 | Brogle | 257/656 |
| 7,759,730 B2 | 7/2010 | Matsuura et al. | |
| 7,776,757 B2 | 8/2010 | Lin et al. | |
| 7,847,315 B2 | 12/2010 | Hamerski et al. | |
| 7,847,347 B2 | 12/2010 | Matsuura et al. | |
| 7,964,970 B2 | 6/2011 | Gerhardt et al. | |
| 8,299,495 B2 | 10/2012 | Inagawa | |
| 8,338,906 B2 * | 12/2012 | Yeh et al. | 257/484 |
| 2001/0042862 A1 | 11/2001 | Epke | |
| 2002/0047124 A1 * | 4/2002 | Kitabatake | 257/73 |
| 2003/0001156 A1 * | 1/2003 | Dev | 257/54 |
| 2003/0201469 A1 | 10/2003 | Lowrey | |
| 2003/0205728 A1 | 11/2003 | Yim et al. | |
| 2004/0051120 A1 | 3/2004 | Kato | |
| 2004/0065903 A1 | 4/2004 | Zheng et al. | |
| 2004/0094819 A1 * | 5/2004 | Saitoh et al. | 257/492 |
| 2004/0169202 A1 | 9/2004 | Kang et al. | |
| 2004/0211974 A1 | 10/2004 | Wu | |
| 2004/0256637 A1 | 12/2004 | Yang | |
| 2005/0117443 A1 * | 6/2005 | Park et al. | 365/232 |
| 2006/0125040 A1 | 6/2006 | Levin et al. | |
| 2007/0034902 A1 | 2/2007 | Kamimuta et al. | |
| 2008/0032480 A1 | 2/2008 | Gonzalez et al. | |
| 2009/0026501 A1 * | 1/2009 | Maher et al. | 257/195 |
| 2009/0057686 A1 | 3/2009 | Fukuda et al. | |
| 2009/0166769 A1 | 7/2009 | Metz et al. | |
| 2009/0283851 A1 | 11/2009 | Chen | |
| 2009/0315114 A1 | 12/2009 | Rakshit et al. | |
| 2010/0084719 A1 | 4/2010 | Masuoka et al. | |
| 2010/0301428 A1 | 12/2010 | Forbes et al. | |
| 2011/0018073 A1 | 1/2011 | Wang et al. | |
| 2012/0228717 A1 * | 9/2012 | Vellianitis et al. | 257/371 |

\* cited by examiner

SCHOTTKY DIODES HAVING METAL GATE ELECTRODES AND METHODS OF FORMATION THEREOF

This is a divisional application of U.S. application Ser. No. 13/082,793, filed on Apr. 8, 2011, and is incorporated herein by reference.

TECHNICAL FIELD

The present invention relates generally semiconductor devices, and more particularly to Schottky diodes having metal gate electrode and methods of formation thereof.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a trend in the semiconductor industry towards reducing the size of features and/or improving performance of the semiconductor devices. For example, features of devices are scaled to improve on current performance, performance of parasitic resistances are decreased etc. However, such technological progress requires overcoming many challenges. One challenge involves the contact formation in the front-end-of-line that includes silicidation of active area and forming contacts to it through an insulating layer. Scaling challenges these processes by decreasing the contact sizes as well as the contact to contact spacing. Increasingly silicidation introduces defects that significantly reduce process yields. Another challenge is the improvement in the performance of diodes used in semiconductor devices.

Schottky diodes, which are metal-semiconductor diodes, are conventionally formed by contacting silicide regions with semiconductor regions. This is because of the compatibility of silicide based diodes with conventional semiconductor processing. However, such diodes have a number of limitations. For example, they are susceptible to increased leakage currents at corners, for example, due to thinner silicidation as well as due to the existence of increased field regions.

FIG. 1, which includes FIGS. 1a and 1b, illustrates a conventional silicide based Schottky diode, wherein FIG. 1a illustrates a top view and FIG. 1b illustrates a cross-sectional view of the semiconductor device.

Referring to FIG. 1b, a Schottky contact is made between a silicide contact region 23 and a first doped region 20. The silicide contact region 23 is formed on the first doped region 20 and is formed between adjacent isolation regions 50. The contact to the semiconductor is made through silicide regions 22 formed over the second doped region 21, which is a heavily doped region for contacting the semiconductor portion of the diode.

The isolation regions 50 prevent the silicide contact region 23 from directly contacting the silicide regions 22. In some devices, the silicide contact region 23 is formed under the contact plugs 31, for example, in trenches under the contact plugs 31, so that a plurality of silicide contact regions 23 are formed under the contact plugs 31.

SUMMARY OF THE INVENTION

In accordance with an embodiment of the present invention, a semiconductor device comprises a first doped region disposed in a first region of a substrate. A first metal electrode comprising a first portion of a metal layer is disposed over and contacts the first doped region. A second doped region is disposed in a second region of the substrate. A dielectric layer is disposed on the second doped region. A second metal electrode comprising a second portion of the metal layer is disposed over the dielectric layer. The second metal electrode is capacitively coupled to the second doped region.

In accordance with an alternative embodiment of the present invention, a semiconductor device comprises a first doped region disposed in a first region of a substrate. A metal electrode comprising a metal layer is disposed over and contacts the first doped region. The metal electrode is surrounded by a spacer.

In accordance with an alternative embodiment of the present invention, a transistor comprises a channel region of a first doping type disposed in a substrate. A gate dielectric layer is disposed over the channel region. A gate electrode is disposed over the gate dielectric layer. A first source/drain region of a second doping type is disposed in and/or over the substrate and coupled to the channel region. The second doping type is opposite to the first doping type. The first source/drain region is physically separated from the channel region. The transistor further comprises a first contact electrode disposed over the first source/drain region. The first contact electrode comprises a first portion of a metal layer. The gate electrode comprises a second portion of the metal layer. The second portion of the metal layer contacts the first source/drain region.

In accordance with an embodiment of the present invention, a method of fabricating a semiconductor device comprises forming a gate dielectric layer over a substrate, and forming a first dummy gate electrode over the gate dielectric layer in a first region of the substrate. The method further includes forming a second dummy gate electrode over the gate dielectric layer in a second region of the substrate. A first doped region is formed under the first dummy gate electrode. A first trench and a second trench are formed by removing the first dummy gate electrode and the second dummy gate electrode. A portion of the gate dielectric layer in the first region exposed by the first trench is removed. The further comprises forming a metal layer over the substrate. A first portion of the metal layer contacts the first doped region in the first trench and a second portion of the metal layer at least partially fills the second trench.

In accordance with yet another embodiment of the present invention, a method of fabricating a semiconductor device comprises forming a gate dielectric layer over a substrate, and forming a first dummy gate electrode over the gate dielectric layer in a first region of the substrate. The first dummy gate electrode comprises a first conductive layer and a second conductive layer over the first conductive layer. A second dummy gate electrode is formed over the gate dielectric layer in a second region of the substrate. The second dummy gate electrode comprises a third conductive layer and a fourth conductive layer over the third conductive layer. A first doped region is formed under the first dummy gate electrode. A first trench is formed by removing the first dummy gate electrode. A second trench is formed by removing the fourth conductive layer. A portion of the gate dielectric layer in the first region exposed by the first trench is removed. A metal layer is formed over the substrate such that a first portion of the metal layer contacts the first doped region in the first trench and a second portion of the metal layer at least partially fills the second trench.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a and 1b, illustrates a conventional semiconductor diode, wherein FIG. 1a illustrates a top view and FIG. 1b illustrates a cross-sectional view of the semiconductor device.

FIG. 2, which includes

FIG. 3, which includes

FIG. 4, which includes

FIG. 5, which includes

FIG. 6, which includes

FIG. 7, which includes FIGS. 7a and 7b, illustrates a semiconductor diode in accordance with an alternative embodiment of the invention, wherein FIG. 7a illustrates a top view and FIG. 7b illustrates a cross-sectional view of the semiconductor device;

FIG. 8, which includes FIGS. 8a and 8b, illustrates a semiconductor diode in accordance with an alternative embodiment of the invention, wherein FIG. 8a illustrates a top view and FIG. 8b illustrates a cross-sectional view of the semiconductor device; and FIG. 9, which includes FIGS. 9a and 9b, illustrates a semiconductor diode in accordance with an alternative embodiment of the invention, wherein FIG. 9a illustrates a top view and FIG. 9b illustrates a cross-sectional view of the semiconductor device.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of a semiconductor device having a Schottky diode in accordance with an embodiment of the invention will be described using FIG. 2. Further structural embodiments will be described using FIGS. 5d and 6-9. FIGS. 3-5 describe various embodiments of manufacturing a semiconductor device having such Schottky contacts using processes compatible with semiconductor processing.

Figure 1A:
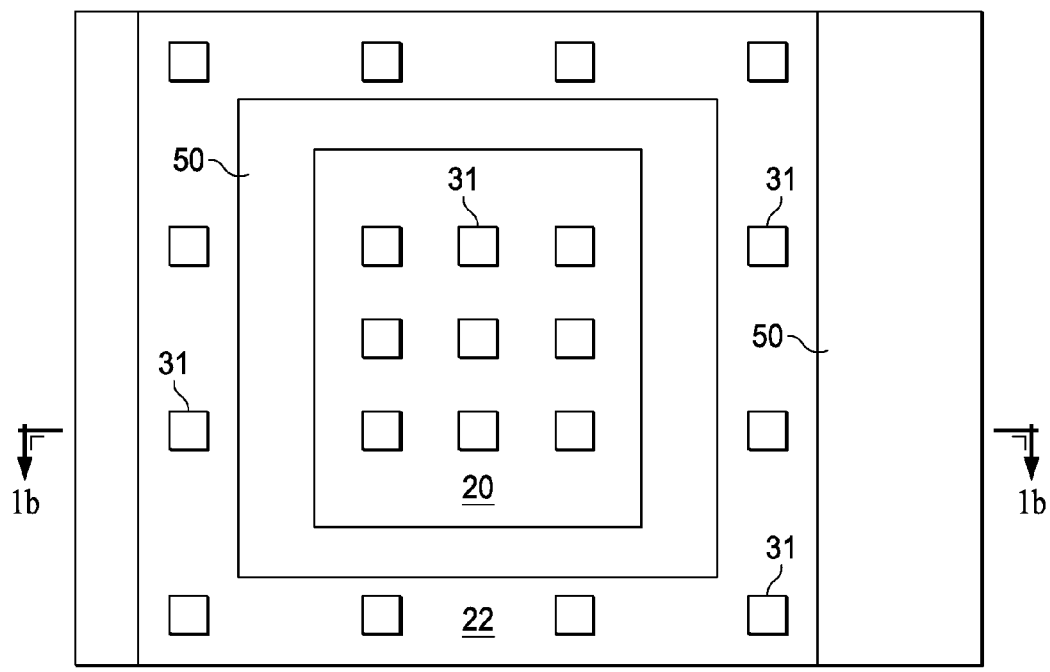
Figure 1B:
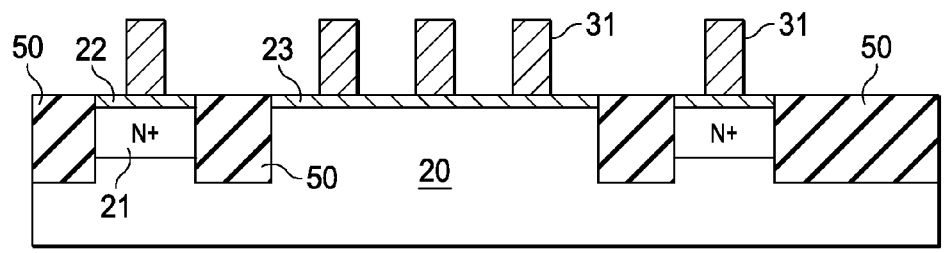
Figure 2A:
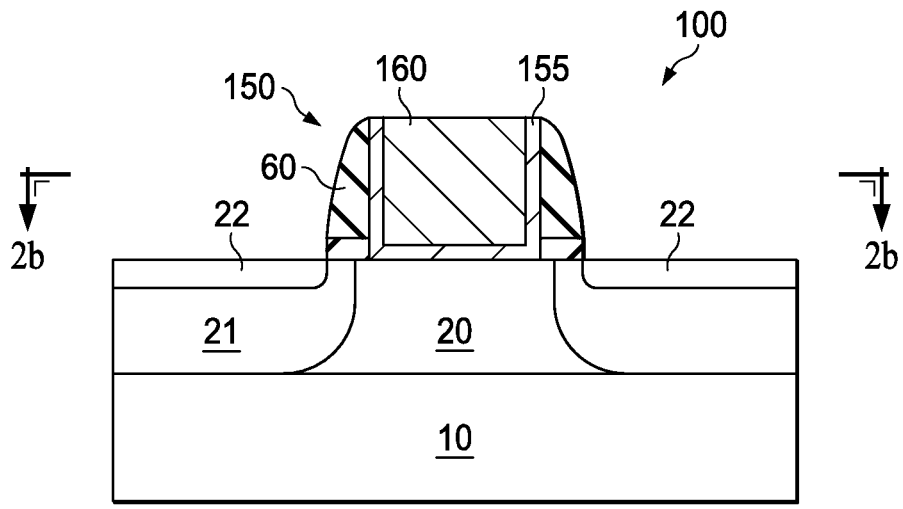
FIGS. 2a and 2b, illustrates a cross-sectional view of a Schottky diode in accordance with an embodiment of the invention.
Figure 2B:
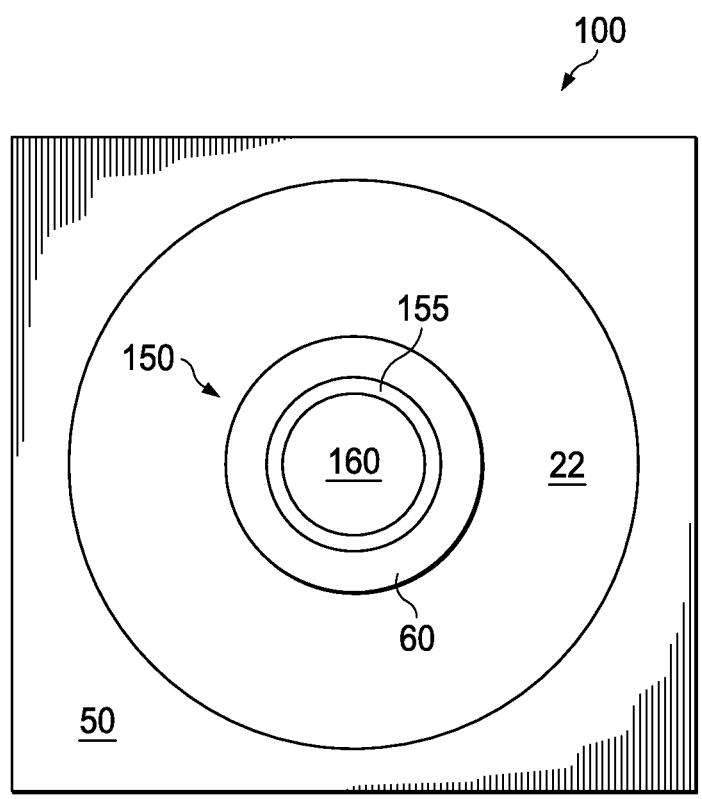

FIG. 2, which includes FIGS. 2a and 2b, illustrates a cross-sectional view of a Schottky diode in accordance with an embodiment of the invention, wherein FIG. 2a illustrates a cross-sectional view and FIG. 2b illustrates a top view.

As illustrated in FIG. 2a, the Schottky diode 100 is a metal-semiconductor diode having a metal electrode 150 contacting a semiconductor layer, e.g., a first doped region 20. The first doped region 20 may be a p-type material, an n-type material, or an intrinsic material. The first doped region 20 is formed within and/or over a substrate 10. The substrate 10 may be a semiconductor substrate in various embodiments. The substrate 10 may be a semiconductor bulk substrate or a semiconductor on insulator substrate. Some examples of the substrate 10 include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In various embodiments, the substrate 10 may include blanket epitaxial layers. In various embodiments, the substrate 10 may be a silicon wafer, a germanium wafer, or may be a compound semiconductor substrate including indium antimonide, indium arsenide, indium phosphide, gallium nitride, gallium arsenide, gallium antimonide, lead telluride, or combinations thereof.

The metal electrode 150 comprises a first metal layer 155 and a fill metal 160 in one embodiment. The first metal layer 155 may comprise titanium, tantalum, and their nitrides in one embodiment. In various embodiments, the first metal layer 155 and the fill metal 160 comprise aluminum nitride, hafnium nitride, tantalum nitride, titanium nitride, titanium aluminum nitride, zirconium nitride, tantalum carbide, hafnium carbide, zirconium carbide, and combinations thereof. In various embodiments, the fill metal 160 may comprise aluminum, copper, tungsten, alloys and compounds thereof, and combinations thereof as well as silicides such as cobalt silicide, nickel silicide etc.

The metal electrode 150 is surrounded by spacers 60, which may include a plurality of spacers comprising different insulating materials. The spacers 60 may include a layer of oxide, followed by a layer of nitride, and a layer of oxide in one embodiment. The spacers 60 may include "L" shaped component in one embodiment.

The built-in potential between the first doped region 20 and the metal electrode 150 forms the Schottky diode 100. For example, if the first doped region 20 is doped n-type, the difference between the Fermi energy of the metal electrode 150 (metal work function) and the semiconductor work function (electron affinity) is the barrier seen by electrons in the metal trying to move into the first doped region 20. Similarly, if the first doped region 20 is a p-type material, the barrier height is given by the difference between the valence band edge and the metal work function of the metal electrode 150. This barrier is called the Schottky barrier. Therefore, a metal-semiconductor junction will form a barrier for electrons and holes if the work function of the metal electrode 150 is somewhere between the conduction and valence band edge of the first doped region 20.

Similarly, electrons from the conductor band of the first doped region 20 see a barrier similar to a p-n junction, which is the difference between the Fermi energy of the metal and the quasi Fermi energy level of the first doped region 20. Therefore, this built-in barrier can be optimized by changing the metal work function and/or the first doped region 20.

Consequently, Schottky diodes are used in many applications as both discrete components or as contacts for active components such as transistors, capacitors, diodes etc. For example, source/drain regions in transistors are heavily doped to reduce parasitic resistances. As contacts to heavily doped source/drain regions, the metal work functions can be adjusted to match the doping levels of the semiconductor regions.

Further, a Schottky diode is a majority carrier device in which electron-hole recombination processes are not important. Hence, Schottky diodes have a much faster response under forward bias conditions than p-n junction diodes. Therefore, Schottky diodes are used in applications where the speed of a response is important, for example, in microwave detectors, mixers, and varactors etc.

As illustrated in FIG. 2b, the Schottky diode 100 can have any suitable layout. FIG. 2b shows an annular layout in which the metal electrode 150 forms the central portion and the silicide regions 22 form the outer contact to the first doped regions 20. The silicide regions 22 are separated from the metal electrode 150 by the spacer 60, which surrounds the metal electrode 150 because the spacer 60 is formed on all sidewalls of the metal electrode 150. The Schottky diode 100 is isolated using isolation regions 50 in one embodiment.

FIG. 3, which includes FIGS. 3a-3g, illustrates a semiconductor device during various stages of fabrication in accordance with an embodiment of the invention.

Figure 3A:
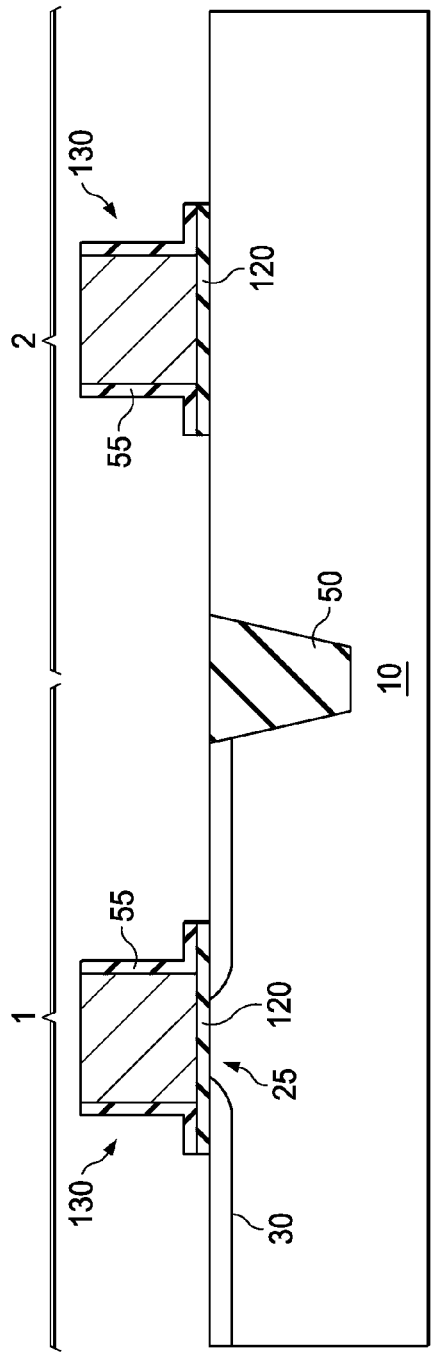
FIGS. 3a-3g, illustrates a semiconductor device during various stages of fabrication in accordance with an embodiment of the invention.
Figure 3B:
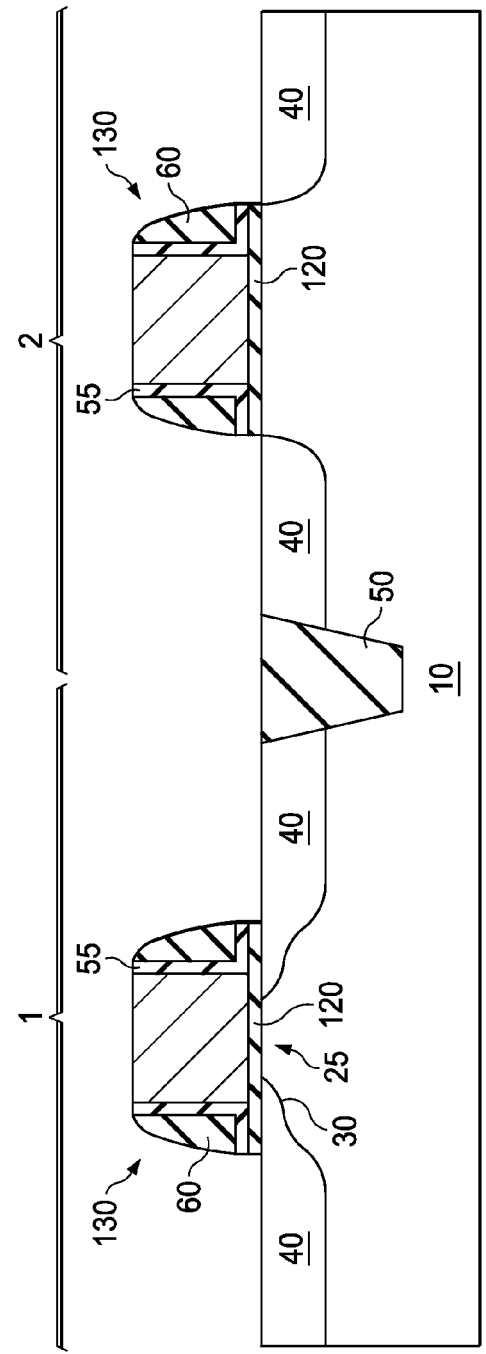

Referring to FIG. 3a, a transistor 200 is being fabricated in a first region 1 of the substrate 10 and a Schottky diode 100 is being fabricated simultaneously in a second region 2 of the substrate 10.

Isolation regions 50 are formed within the substrate 10 using conventional techniques. In one embodiment, the isolation regions 50 comprise shallow trench isolation.

As illustrated in FIG. 3a, a gate dielectric layer 120 is formed over a substrate 10. The gate dielectric layer 120 may be a high-k dielectric layer. In one or more embodiments, as illustration, the gate dielectric layer 120 may comprise hafnium oxide, zirconium oxide, titanium oxide, aluminum oxide, and combinations thereof. In various embodiments, the gate dielectric layer 120 may comprise other high-k gate dielectric materials according to application being used for. The gate dielectric layer 120 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric layer 120 may be deposited using other suitable deposition techniques.

A dummy gate 130 is formed over the gate dielectric layer 120. In one embodiment, a dummy gate layer is deposited and patterned using known photolithography techniques to create the dummy gate 130 of the proper pattern. The dummy gate 130 may comprise polysilicon in one embodiment. The polysilicon may be amorphous or partially amorphous in some embodiments. The dummy gate 130 may have a thickness of between about 400 Å to 2000 Å and may be deposited using CVD, PVD, ALD, or other deposition techniques.

Thin spacers 55 may be formed on the sidewalls of the dummy gate 130. The thin spacers 55 may comprise an oxide or a nitride in various embodiments. The thin spacers 55 are typically formed by the deposition of a conformal layer followed by an anisotropic etch. The process can be repeated to form multiple layers in various embodiments. In one embodiment, the thin spacers 55 may be formed by oxidation, for example, if the dummy gate 130 comprises polysilicon or other materials that may form stable insulating oxide. The thin spacers 55 may include an oxide spacer and a nitride spacer in some embodiments.

After forming the thin spacers 55, the source/drain extension regions 30 and halo regions are formed in the first region 1. However, in one embodiment, the source/drain extension and the halo implants are skipped in the second region 2. For example, the diode regions (second region 2) may be masked when implanting to form source/drain extension regions 30.

In the first region 1, the source/drain extension regions may be implanted using the dummy gate 130 and the thin spacers 55 as a mask. Other implants (e.g., pocket implants, halo implants or double diffused regions) can also be performed as desired. The extension implants also define the channel region 25. If a p-type transistor is to be formed, a p-type ion implant along with an n-type halo implant is used to form the source/drain extension regions. If an n-type transistor is to be formed, an n-type ion implant along with a p-type halo implant is used to form the extension regions.

As a result of forming the source/drain extension regions 30 (and the halo regions), the channel region 25 is formed under the dummy gate 130.

Figure 3C:
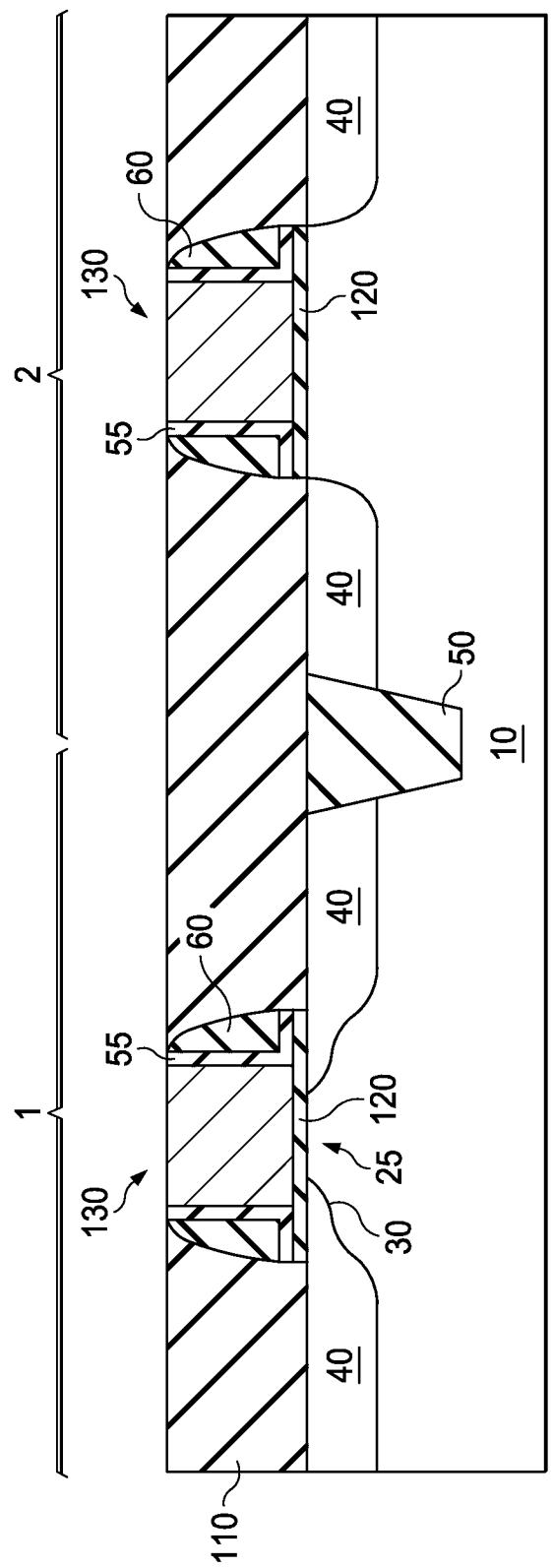

As next illustrated in FIG. 3c, spacers 60 are formed on the sidewalls of the existing thin spacers 55. FIG. 3c shows the device after it has been exposed to an ion implant step and rapid thermal anneal which forms the source/drain regions 40. Similar to the formation of the extension regions, if a p-type transistor is to be formed, a p-type ion implant is used to form the heavily doped deep source/drain regions. If an n-type transistor is to be formed, an n-type ion implant is used to form the heavily doped source/drain regions. A source/drain anneal, which may include rapid thermal anneal, spike anneals, laser anneal, flash anneal, and combinations thereof, follows the source/drain implants and forms the active junctions.

Although the spacers 60 are used to separate the implanted source/drain dopants, after the source/drain anneal, some portion of the source/drain region 40 may extend under the spacers 60.

A etch stop liner (not shown) may be deposited over the top surface of the substrate 10. A planarization layer 110, such as spun on glass, is then formed over the etch stop liner. In one or more embodiments, the planarization layer 110 may comprise a dielectric material. In various embodiments, the planarization layer 110 may comprise materials such as doped glass (BPSG, PSG, BSG), organo silicate glass (OSG), fluorinated silicate glass (FSG), spun-on-glass (SOG), silicon nitride, and plasma enhanced tetraethyloxysilane (TEOS).

A planarization process may be formed after the forming the planarization layer 110. The planarization process is stopped when the dummy gate 130 is exposed. The planarization process comprises, for example, a CMP technique or a timed wet etch process, e.g., a hot phosphorous bath.

In some embodiments, after the above planarization process, the planarization layer 110 may be etched to form recesses and a etch resist layer may be deposited. A second planarization step may be performed to expose the dummy gate 130 thereby leaving etch resistant layer within the recesses of the planarization layer 110.

Figure 3D:
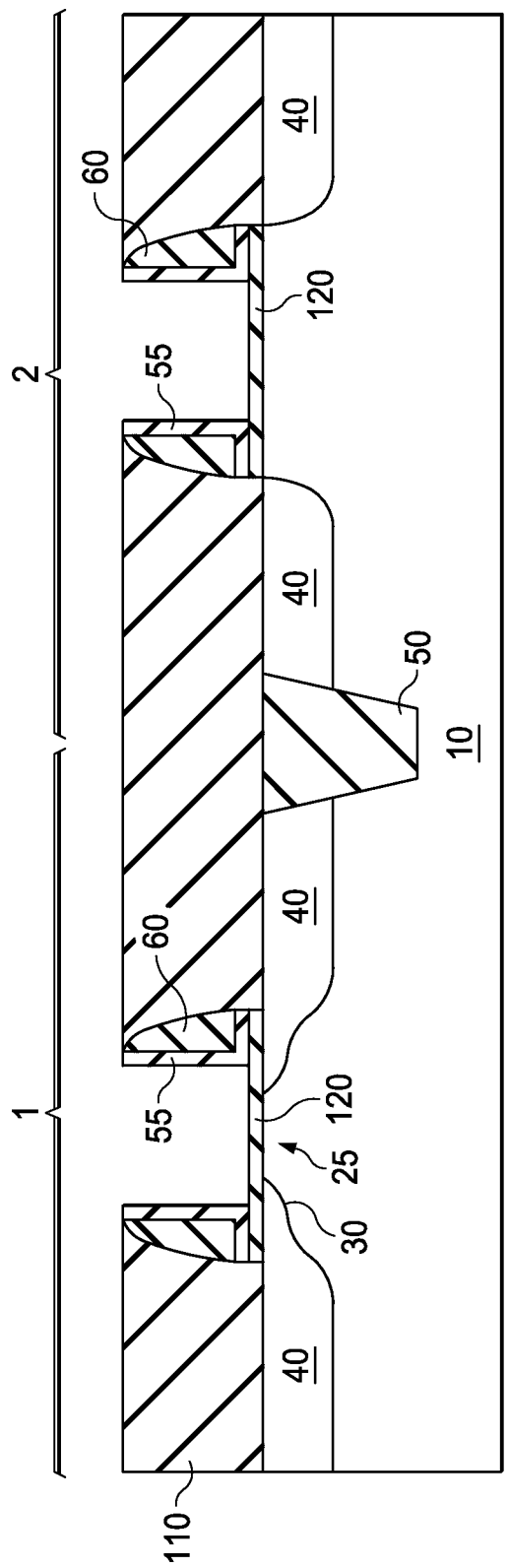

The dummy gate 130 is selectively etched exposing the underlying gate dielectric layer 120 (FIG. 3d). The planarization layer 110 (and optionally the embedded etch resistant layer) protects the substrate 10, which would otherwise be exposed, during the selective etching of the dummy gate 130.

Figure 3E:
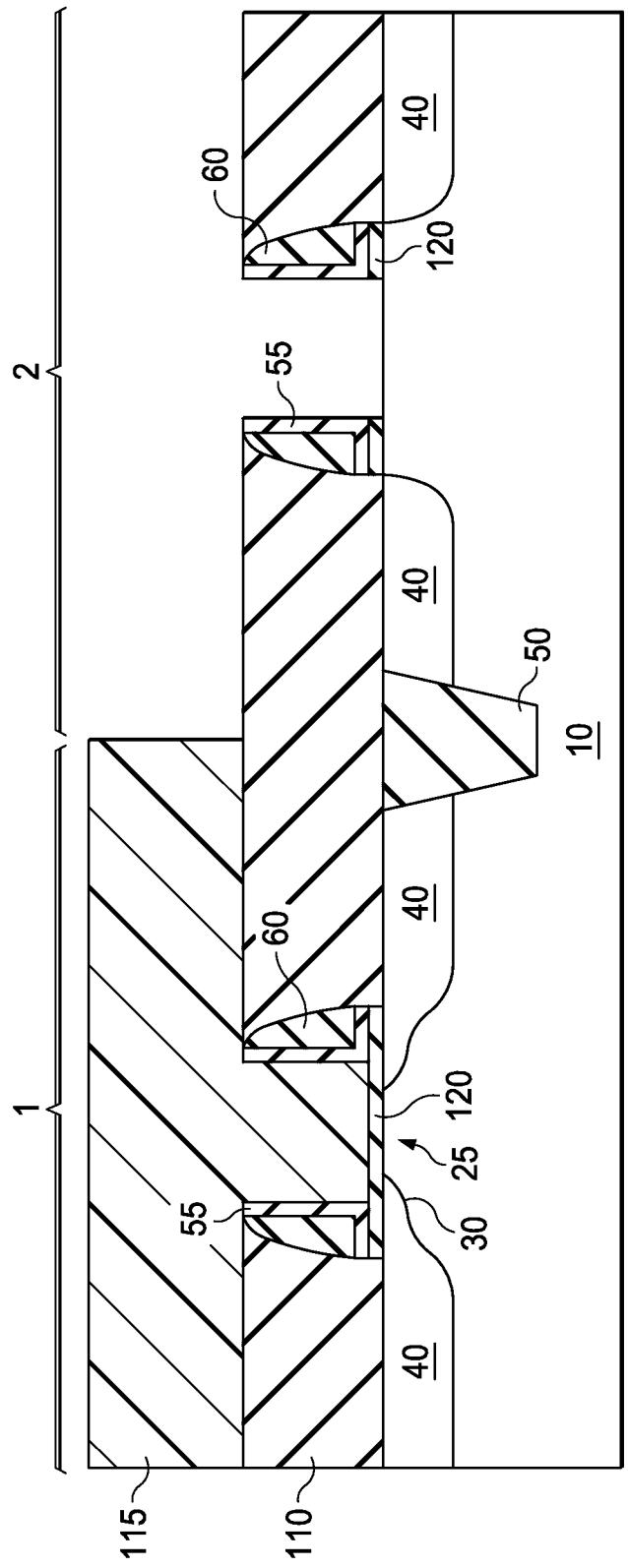

As next illustrated in FIG. 3e, the first region 1 is blocked using a patterned resist layer 115, which may be formed using a lithographic process. The exposed second region 2 is subjected to an additional etching step which removes the gate dielectric layer 120 and exposes the underlying substrate 10. In one embodiment, a selective reactive ion etch may be used to remove the gate dielectric layer 120 to avoid etching the thin spacers 55 and/or the spacers 60. However, some etching of the thin spacers 55 and the spacers 60 may be tolerable as it only extends the length of the Schottky diode.

Figure 3F:
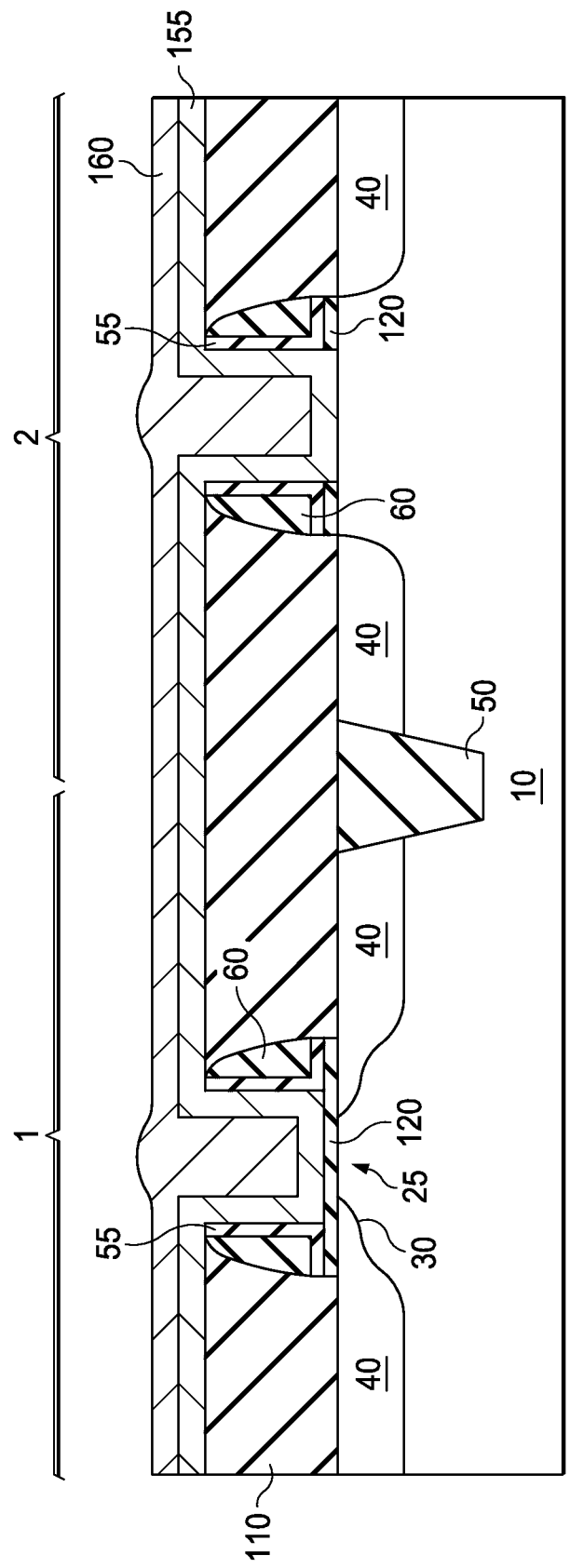

A new metal is formed in the trenches, for example, which may fill the trenches, after the removal of the dummy gate 130 as illustrated in FIG. 3f. The patterned resist layer 115 is removed exposing the gate dielectric layer in the first region 1 and the substrate 10 in the second region 2. A first metal layer 155 is deposited followed by the deposition of the fill metal 160. In various embodiments, the first metal layer 155 comprises aluminum nitride, hafnium nitride, tantalum nitride, titanium nitride, titanium aluminum nitride, zirconium nitride, tantalum carbide, hafnium carbide, zirconium carbide, and combinations thereof. In one embodiment, the first metal layer 155 and the fill metal 160 may comprise the same metal and may be deposited in a single process step.

Alternatively, the fill metal 160 may be a fill material that is suitable for planarization. Additionally the fill metal 160 may be selected to impart stress within the channel region 25 of the transistor 200. Examples of the fill metal 160 include aluminum, tungsten, copper, titanium, nickel, platinum, palladium, titanium nitride, cobalt silicide, nickel silicide.

Figure 3G:
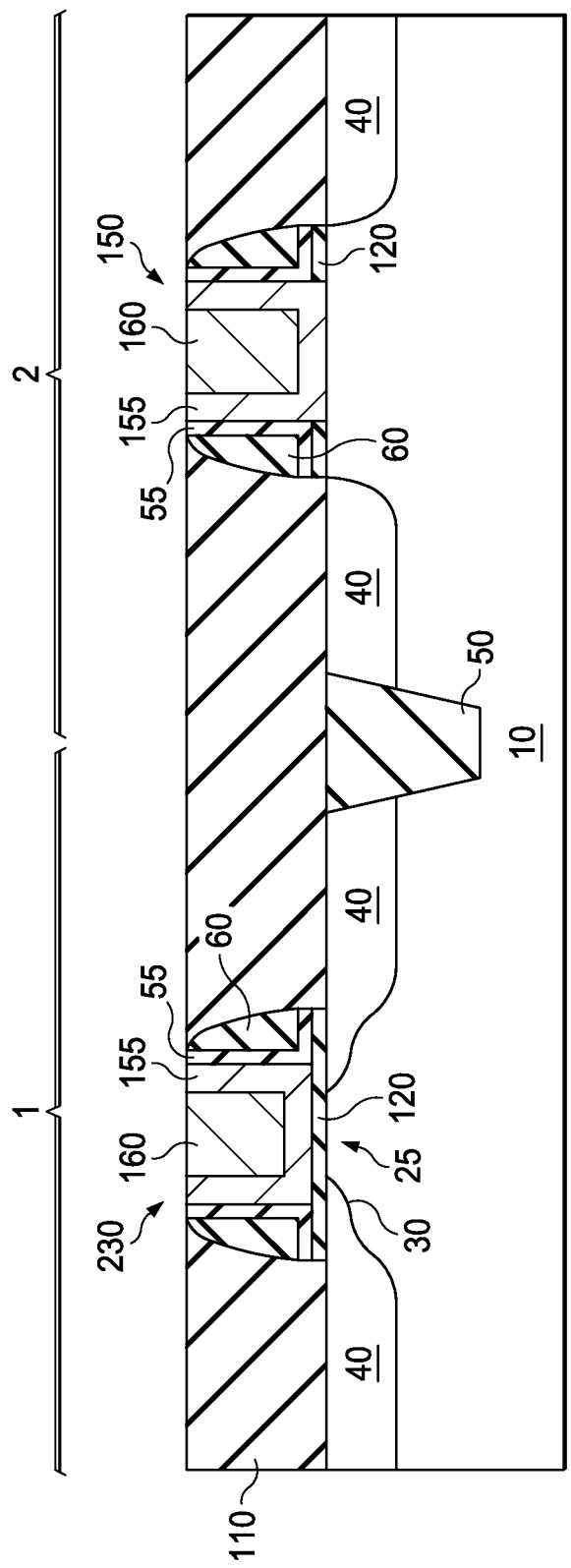

As illustrated in FIG. 3g, a planarization process, which may include chemical and mechanical polishing processes, may be performed forming the gate electrode 230 in the first region 1 and the metal electrode 150 in the second region 2. The work function of the gate electrode 230 and the metal electrode 150 are about the same in this embodiment.

Further processing continues as in conventional processing. The planarization layer 110 may be removed followed by the removal of etch stop liner in some embodiment. In other embodiments, the planarization layer 110 may be used as part of the inter level dielectric layer.

FIG. 4, which includes FIGS. 4a-4d, illustrates a semiconductor device including the Schottky diode in various stages of fabrication in accordance with another embodiment of the present invention.

Figure 4A:
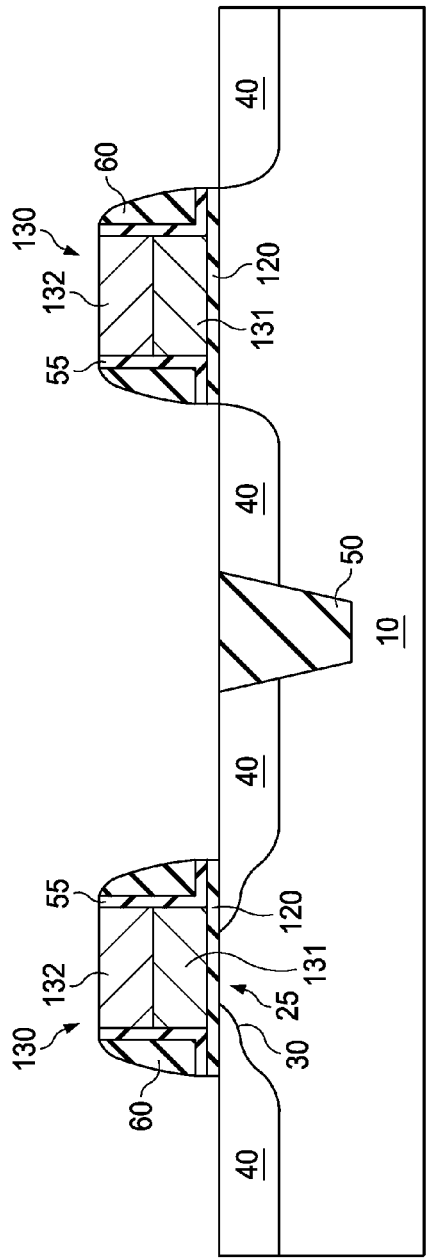
FIGS. 4a-4d, illustrates a semiconductor device including the Schottky in various stages of fabrication in accordance with another embodiment of the present invention.

Referring to FIG. 4a, a gate dielectric layer 120 and a dummy gate 130 are formed as in prior embodiments. However, unlike the prior embodiment, the dummy gate 130 includes a bi-layer stack.

In this embodiment, a dummy gate 130 comprising a first conductive material 131 and a second conductive material 132 are deposited. The first conductive material 131 and the second conductive material 132 are patterned and processed as described in FIG. 2a.

In various embodiments, the first conductive material 131 comprises tantalum nitride and/or titanium nitride. In other embodiments, the first conductive material 131 comprises tungsten, tungsten nitride, molybdenum nitride, hafnium nitride, zirconium nitride, tantalum carbide, hafnium carbide, tantalum carbide, zirconium carbide, tantalum carbide nitride, titanium aluminum nitride. The first conductive material 131 may be chosen to have a proper work function for the design field effect transistor (FET). Alternatively, in one embodiment, a mid-gap metal gate material, e.g., stoichiometric titanium nitride or tantalum nitride, may be used because the final work function is adjusted in the "gate-last" stage of the process flow. In one embodiment, the first conductive material 131 comprises titanium nitride.

In one embodiment, the thickness of the first conductive material 131 is less than about 80 angstrom. Therefore, the first conductive material 131 primarily sets the work function if it is not further doped during the "gate-last" stage of the fabrication process. In another embodiment, the first conductive material 131 may comprise a plurality of distinct and separate material layers. For example, the first conductive material 131 may include diffusion barrier layers as well as reaction barrier layers to avoid different layers with the metal gate electrode from inter-mixing or reacting.

In one embodiment, the first conductive material 131 may be formed using an ALD (Atomic Layer Deposition) process. In one embodiment, the ALD process may be performed in a multi-chamber tool system, as are known in the art, which may comprise a first chamber for forming the first conductive material 131 and a second chamber for forming the second conductive material 132.

In one embodiment, the second conductive material 132 includes a silicon layer, such as polysilicon or amorphous silicon. The silicon layer may be formed using a vapor deposition process, such as, for example, a chemical vapor deposition (CVD) process. A CVD process using silane ($SiH_4$) may be used to form the silicon layer in one embodiment. In some embodiments, the second conductive material 132 may comprise a metal layer and/or a dielectric layer.

The thickness of the second conductive material 132 may be about 200 angstrom to about 1500 angstrom. The thickness of the second conductive material 132 may be about 200 angstrom or greater in one or more embodiments. In various embodiments, the second conductive material 132 may include a plurality of distinct and separate material layers.

In one or more embodiments, the first conductive material 131 and/or the second conductive material 132 may include diffusion barrier layers such as to prevent in-diffusion of the metal forming the gate contact plugs as well as out-diffusion of atoms from the gate dielectric layer 120.

Referring again to FIG. 4a, the thin spacers 55, the channel region 25, the source/drain extension regions 30 are first formed as described in FIG. 3a. Spacers 60 and source/drain regions 40 are formed as described with respect to FIG. 3b.

Figure 4B:
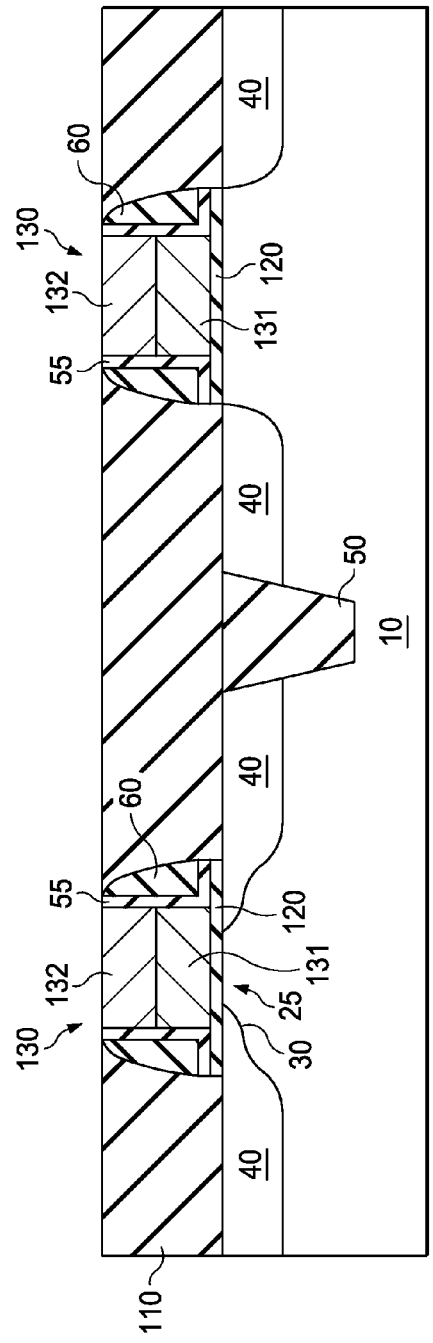

Referring to FIG. 4b, a planarization layer 110, such as a spin on glass layer, is deposited over the substrate 10 and planarized as described with respect to FIG. 3c. The planarization exposes the second conductive material 132.

Figure 4C:
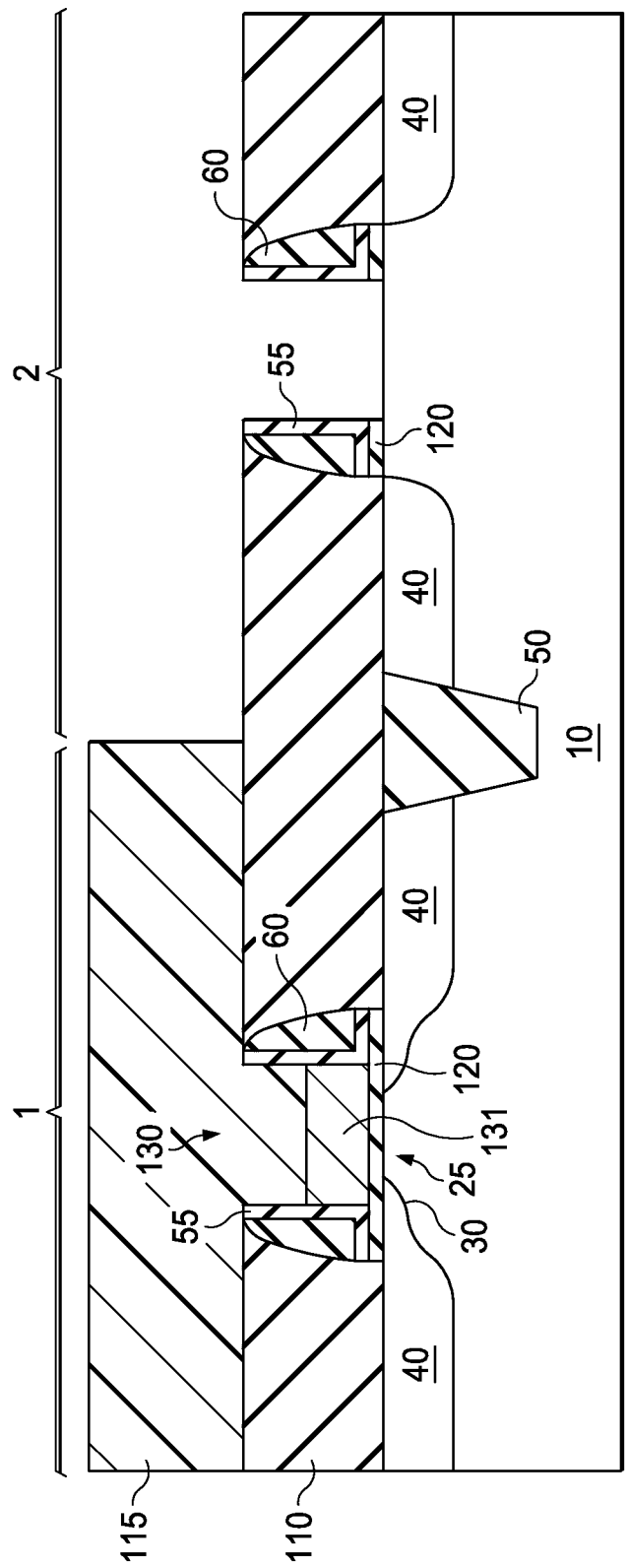

The second conductive material 132 is selectively etched exposing the first conductive material 131 in both the first and the second regions 1 and 2 (FIG. 4c). Now, the first region 1 is blocked using a patterned resist layer 115, and the first conductive material 131 is removed only from the second region 2.

Figure 4D:
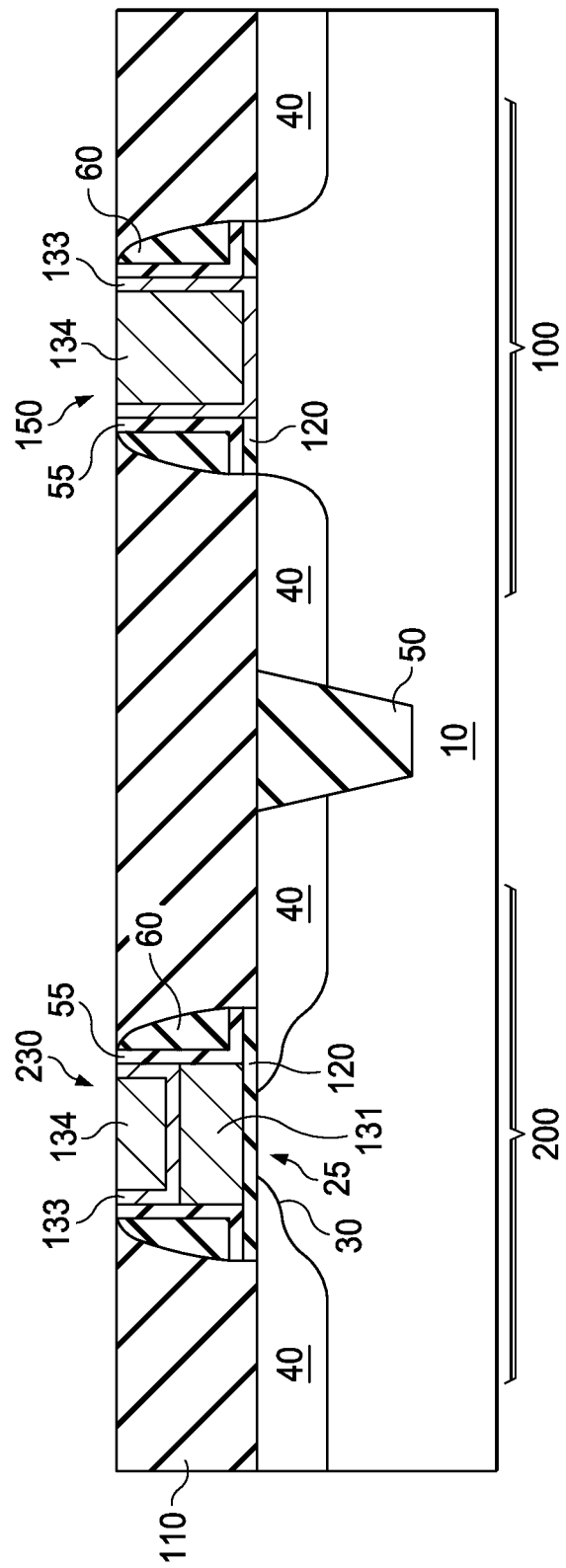

Referring to FIG. 4d, the trench formed by the removal of the second conductive material 132 is filled with a conductor. In various embodiments, a third conductive material 133 is deposited.

Thus, the third conductive material 133 is disposed above the first conductive material 131 forming the gate structure. In some embodiments, the atoms from the third conductive material 133 may diffuse into the first conductive material 131 and may change the electrical behavior (such as work function) of the first conductive material 131. For example, if the first conductive material 131 comprises titanium nitride or tantalum nitride having about a mid-gap work function (e.g., between about 4.2 to about 4.9 eV), addition of third conductive material atoms from the third conductive material 133 may change the work function of the first conductive material 131 closer to the valence band edge or the conduction band edge. In one embodiment, the first conductive material 131 comprises titanium nitride and the third conductive material 133 comprises aluminum, titanium, and/or a lanthanide for lowering the work function of the first conductive material 131 so as to be suitable for NFETs.

An optional fourth conductive material 134 may be deposited over the third conductive material 133. For example, the fourth conductive material 134 may be a fill material that is suitable for planarization. Additionally the fourth conductive material 134 may be selected to impart stress within the channel region 25 of the transistor 200. Examples of the fourth conductive material 134 include aluminum, tungsten, copper, titanium, nickel, platinum, palladium, titanium nitride, cobalt silicide, nickel silicide.

In one or more embodiments, the third conductive material 133 and/or the fourth conductive material 134 may include diffusion barrier layers such as to prevent in-diffusion of the metal forming the gate contact plugs as well as out-diffusion of atoms from the gate dielectric layer 120.

As illustrated in FIG. 4d, the third conductive material 133 and the fourth conductive material 134 are deposited in the second region 2 forming the Schottky diode 100.

Thus the gate electrode 230 is formed in the first region 1 and the metal electrode 150 is formed in the second region 2.

However, in this embodiment, the gate stack forming the transistor 200 is different from the gate stack forming the Schottky diode 100. In various embodiments, the doping type and doping level of the semiconductor substrate may be suitably adjusted. For example, the Schottky diode 100 may be formed on n-type or p-type regions of the substrate 10 depending on the work function of the gate stack of the Schottky diode 100.

Conventional processing continues as in other embodiments, for example, the planarization layer 110 may be removed by etching.

FIG. 5, which includes FIGS. 5a-5e, illustrates a semiconductor device having a Schottky contact during various stages of fabrication in accordance with an embodiment of the present invention.

Figure 5A:
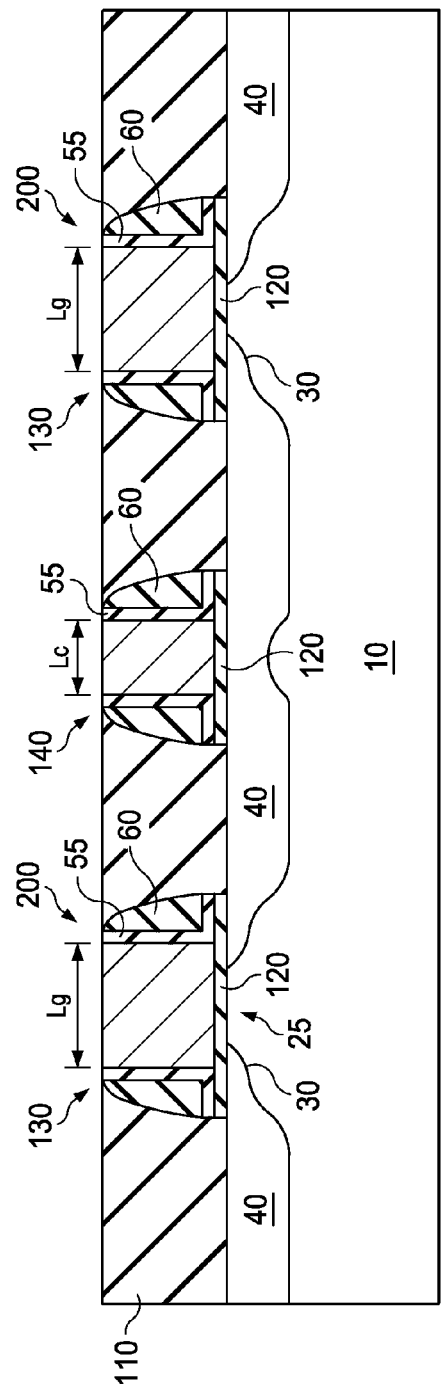
FIGS. 5a-5e, illustrates a semiconductor device having a Schottky contact during various stages of fabrication in accordance with an embodiment of the present invention.
Figure 5B:
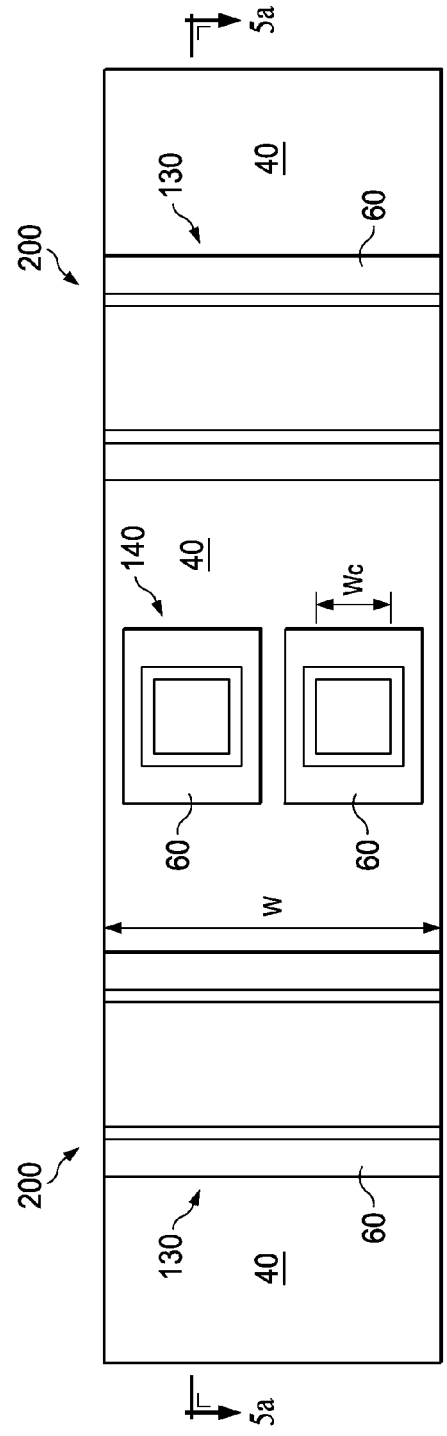

FIG. 5a illustrates a cross-sectional view while FIG. 5b illustrates the corresponding top view. As illustrated in FIG. 5a, dummy gates 130 are formed over a substrate 10 for forming transistors 200. The dummy gates 130 may be formed as in the embodiments described with respect to FIG. 3 or 4. The transistors 200 include thin spacers 55, source/drain extension regions 30, source/drain regions 40, spacers 60 as described above.

Unlike prior embodiments, dummy contacts 140 are patterned while forming the dummy gates 130 (see also top view of FIG. 5b). The dummy contacts 140 are formed simultaneously with the dummy gates 130. Therefore, the dummy contacts 140 have the same structure as the dummy gates 130. However, the dummy contacts 140 are patterned to different dimensions. The dummy contacts 140 are patterned based on the size and pattern for source/drain contacts. For example, the length Lg of the transistors 200 may be larger than the length Lc of the dummy contacts 140. Similarly, the width W of the transistors 200 may be larger than the width Wc of the dummy contacts 140 (FIG. 5b). Because of the smaller size of the dummy contacts 140, the highly doped source/drain regions 40 extend under the dummy contacts 140.

Figure 5C:
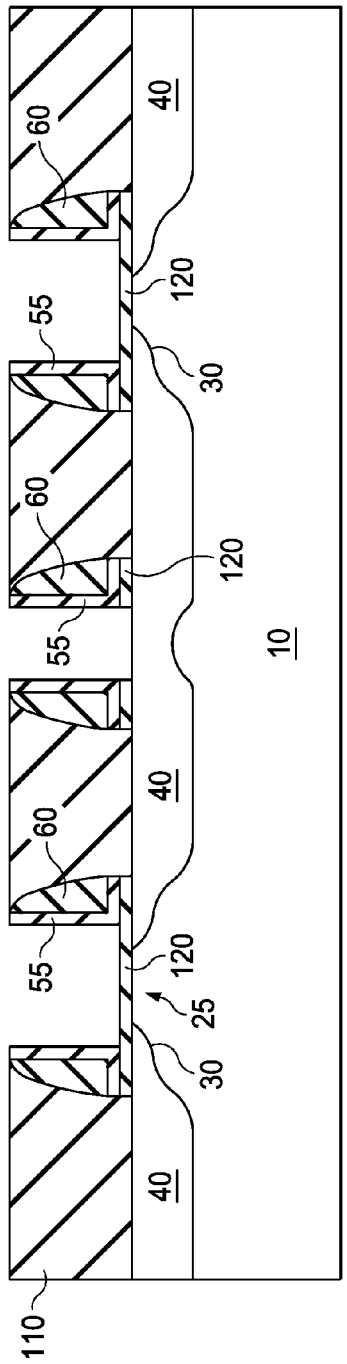

As illustrated in prior embodiment, the dummy gates 130 are removed. The dummy contacts 140 are also etched during the same process. As in prior embodiment, after suitably blocking the gate dielectric layer 120 under the dummy gates 130, the gate dielectric layer 120 under the dummy contacts 140 is removed to expose a portion of the source/drain region 40 (FIG. 5c).

Figure 5D:
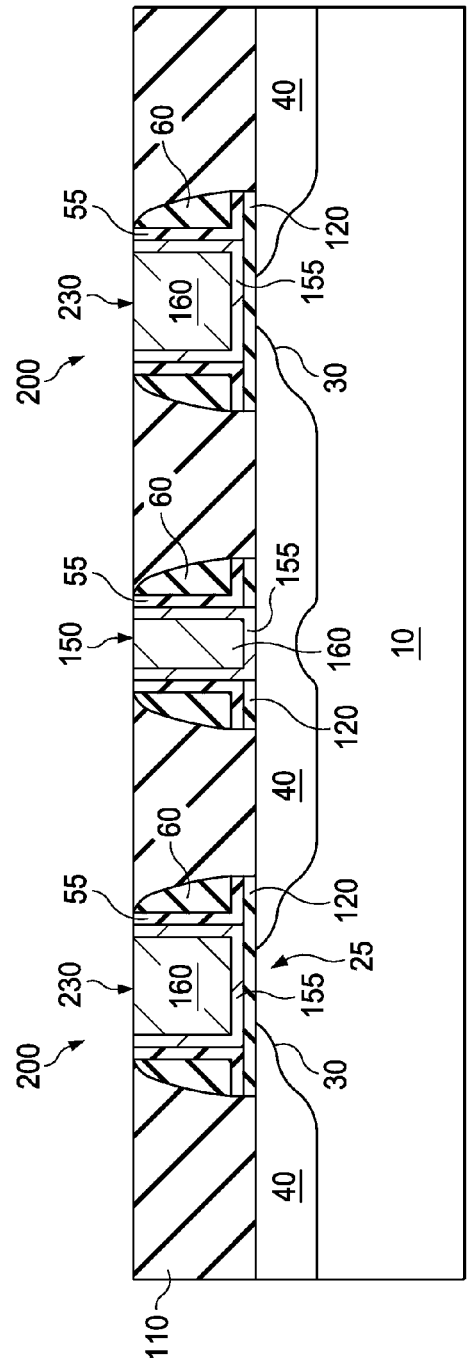

Referring to FIG. 5d, the trenches are filled with a first metal layer 155 and a fill metal 160 as in prior embodiments. The first metal layer 155 and the fill metal 160 in the gate region form the gate electrode 230 while the metal electrode 150 over the source/drain regions 40 form a Schottky contact to the source/drain regions 40.

Figure 5E:
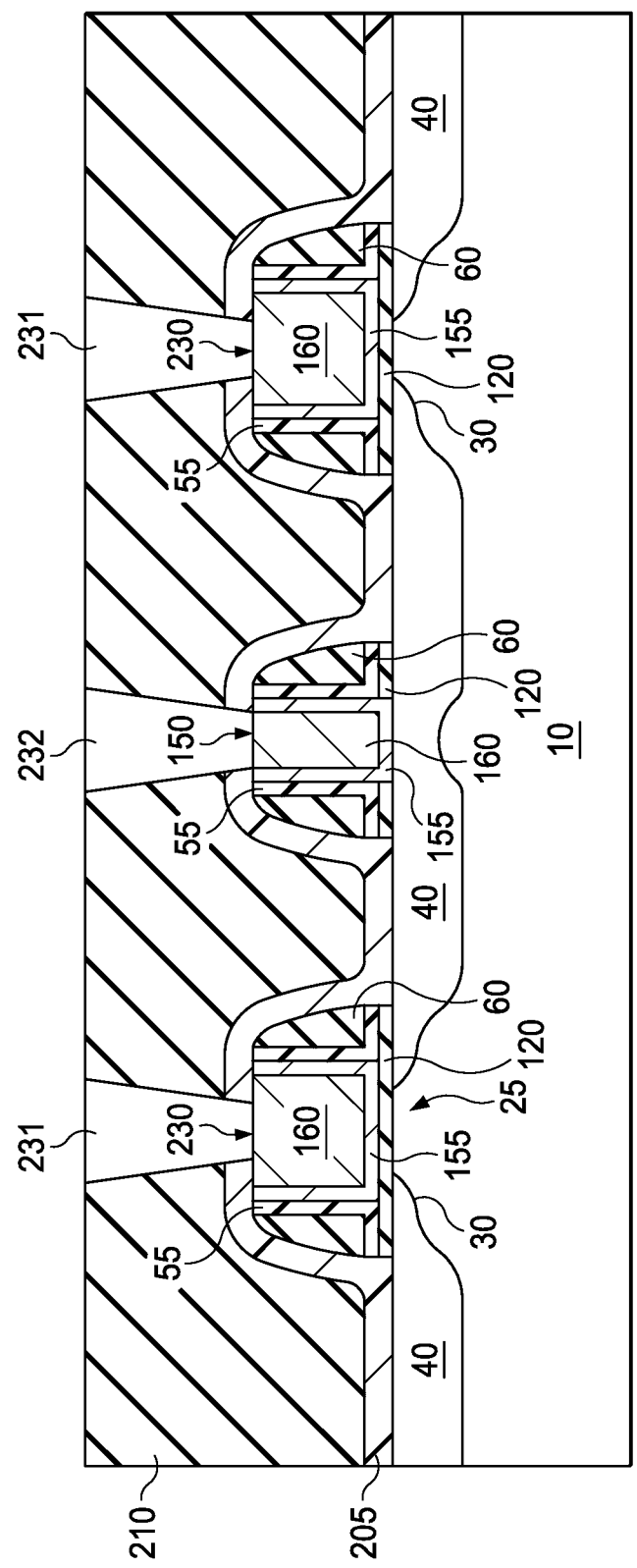

Conventional processing can continue to complete fabrication of the transistor 200 having the Schottky contact. For example, as illustrated in FIG. 5e, in one embodiment, the planarization layer 110 is removed. A etch stop layer 205, which may include a tensile or compressive strained etch stop layer, is deposited so that the channel region 25 can be strained. A inter level dielectric layer 210 is deposited over the etch stop layer 205. The inter level dielectric layer 210 is patterned and contacts are formed. For example, gate contact plugs 131 are formed over the gate electrodes 230 and source/drain contact plugs 132 are formed over the metal electrodes 150.

Figure 6A:
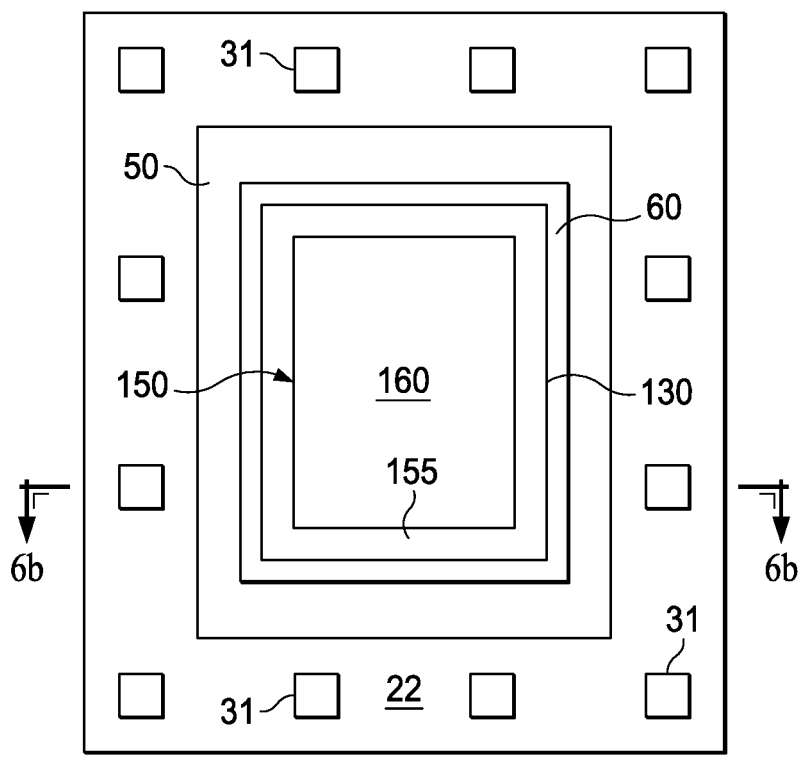
FIGS. 6a and 6b, illustrates a semiconductor diode in accordance with an embodiment of the invention.
Figure 6B:
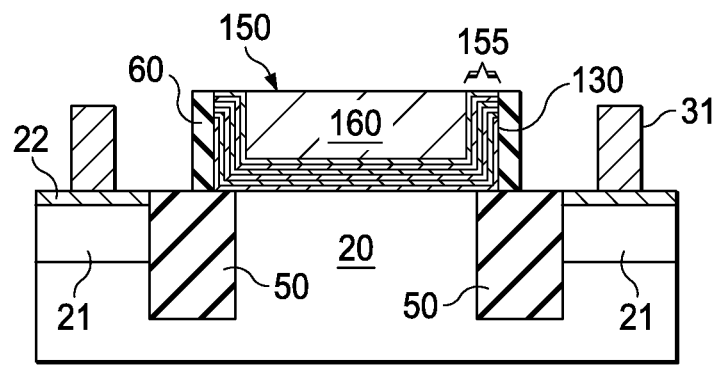

FIG. 6, which includes FIGS. 6a and 6b, illustrates a semiconductor diode in accordance with an embodiment of the invention. FIG. 6a illustrates a top view and FIG. 6b illustrates a cross-sectional view of the semiconductor device in accordance with an embodiment of the invention.

Referring to FIG. 6b, the Schottky diode is formed at the interface between a first doped region 20 and a metal electrode 150. The first doped region 20 is disposed within a substrate 10. In various embodiments, the first doped region 20 may be a well region, for example, an n-type well region. The metal electrode 150 may comprise a plurality of layers as described in prior embodiments. In one embodiment, the metal electrode 150 may comprise a first metal layer 155, which may comprise a plurality of distinct layers having different materials and compositions. For example, the first metal layer 155 may include a diffusion barrier layer, a reaction barrier layer, and layer for controlling the work function of the metal electrode 150 at the interface with the first doped region 20.

The semiconductor diode may comprise isolation regions 50 to isolate the metal electrode 150 from the heavier doped regions such as the second doped regions 21, which may be doped with n$^+$ or p$^+$ doping levels. For example, if the first doped region 20 comprises an n-well region, the second doped regions 21 may comprise a heavily doped n$^+$ region that provides contact to the diode through silicide regions 22 and contact plugs 31.

FIG. 6a also illustrates the location of the dummy gates 130, which determines the edges of the metal electrode 150. The dummy gates 130 in the layout of the diode are defined so as to overlap the isolation regions 50 so that the diode is formed uniformly across all the area between adjacent isolation regions 50. The isolation regions 50 prevent the metal electrode 150 from directly contacting the silicide regions 22, which would short the device.

Figure 7A:
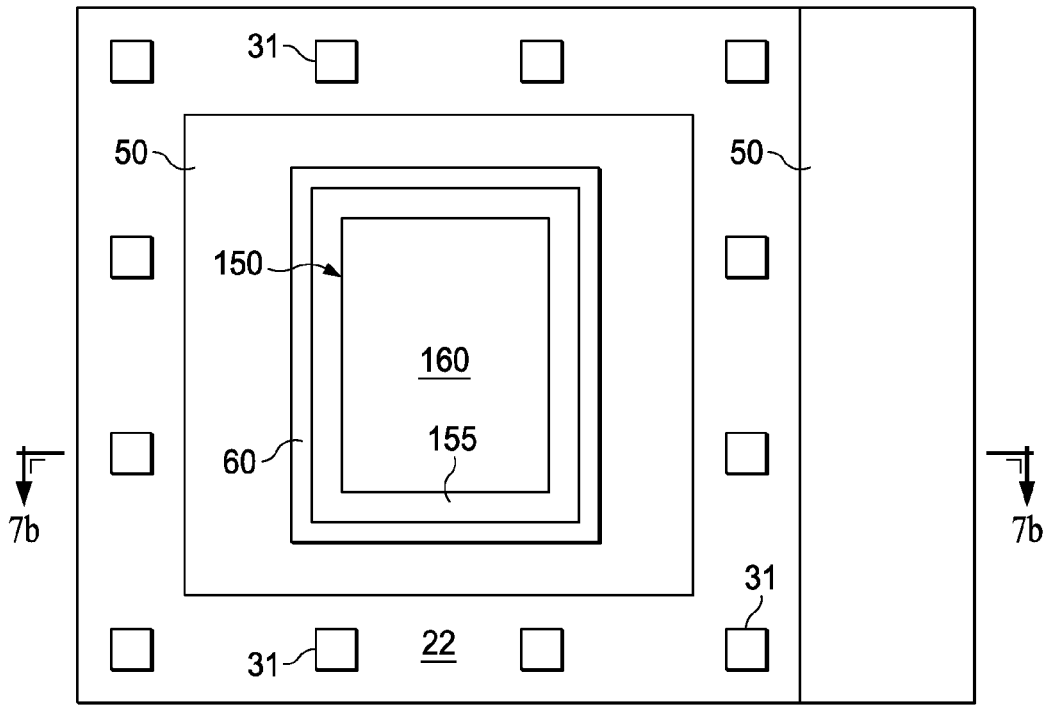
Figure 7B:
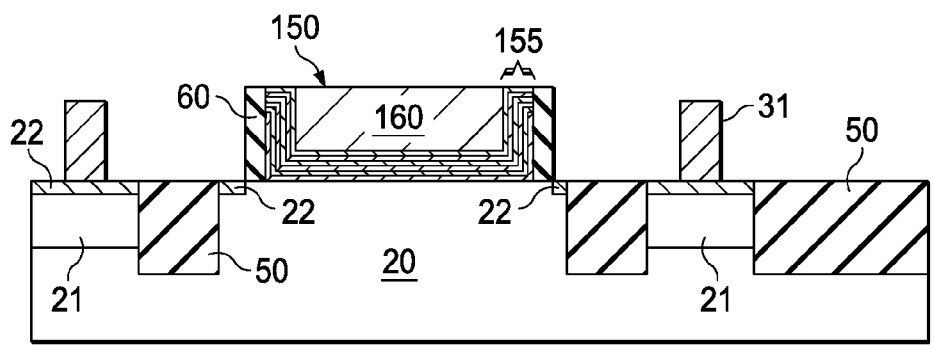

FIG. 7, which includes FIGS. 7a and 7b, illustrates a semiconductor diode in accordance with an alternative embodiment of the invention, wherein FIG. 7a illustrates a top view and FIG. 7b illustrates a cross-sectional view of the semiconductor device.

This embodiment differs from the prior embodiment in that there is no overlap between the metal electrode 150 and the isolation regions 50. This design is possible because of the presence of the spacers 60, which would prevent shorting between the metal electrode 150 and the silicide regions 22.

Figure 8A:
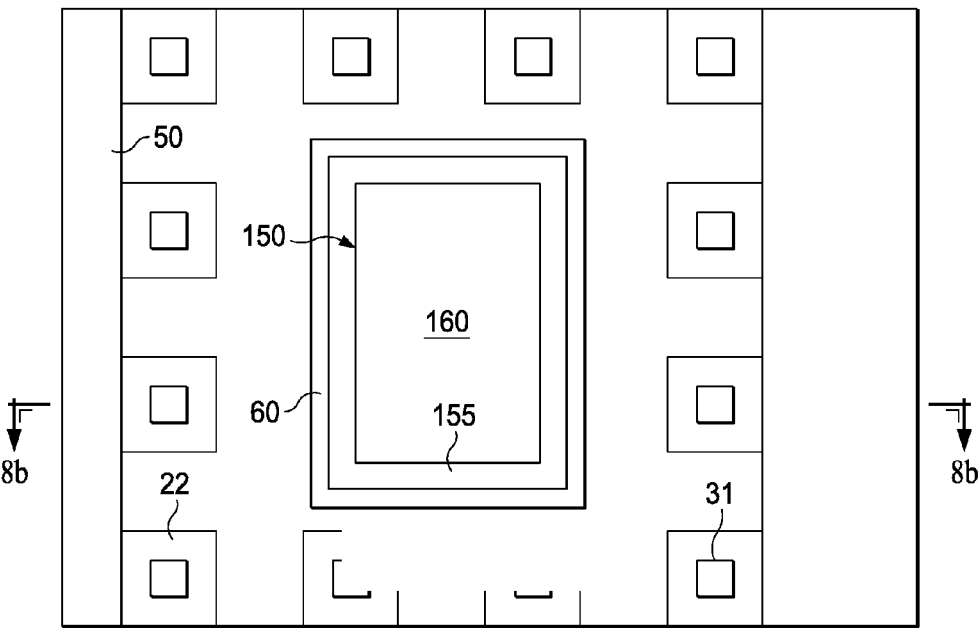
Figure 8B:
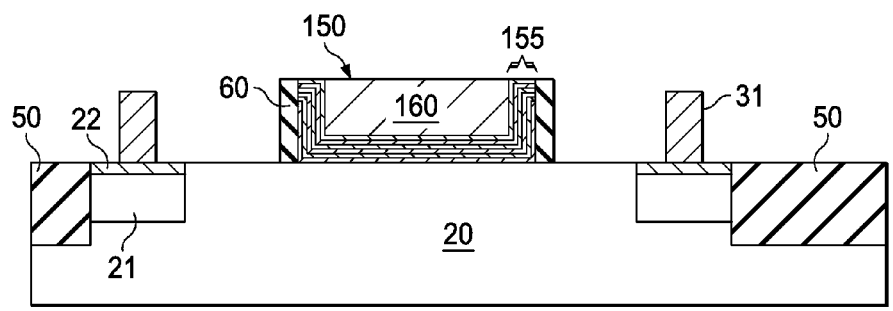

FIG. 8, which includes FIGS. 8a and 8b, illustrates a semiconductor diode in accordance with an alternative embodiment of the invention, wherein FIG. 8a illustrates a top view and FIG. 8b illustrates a cross-sectional view of the semiconductor device.

In this embodiment, the isolation regions 50 are not used to separate the second doped regions 21 from the first doped region 20. The silicide regions 22 are formed under the contact plugs 31, for example, in small trenches. Further, the presence of the spacers 60 prevents any direct contact between the metal electrode 150 and the silicide regions 22 on the second doped regions 21.

Figure 9A:
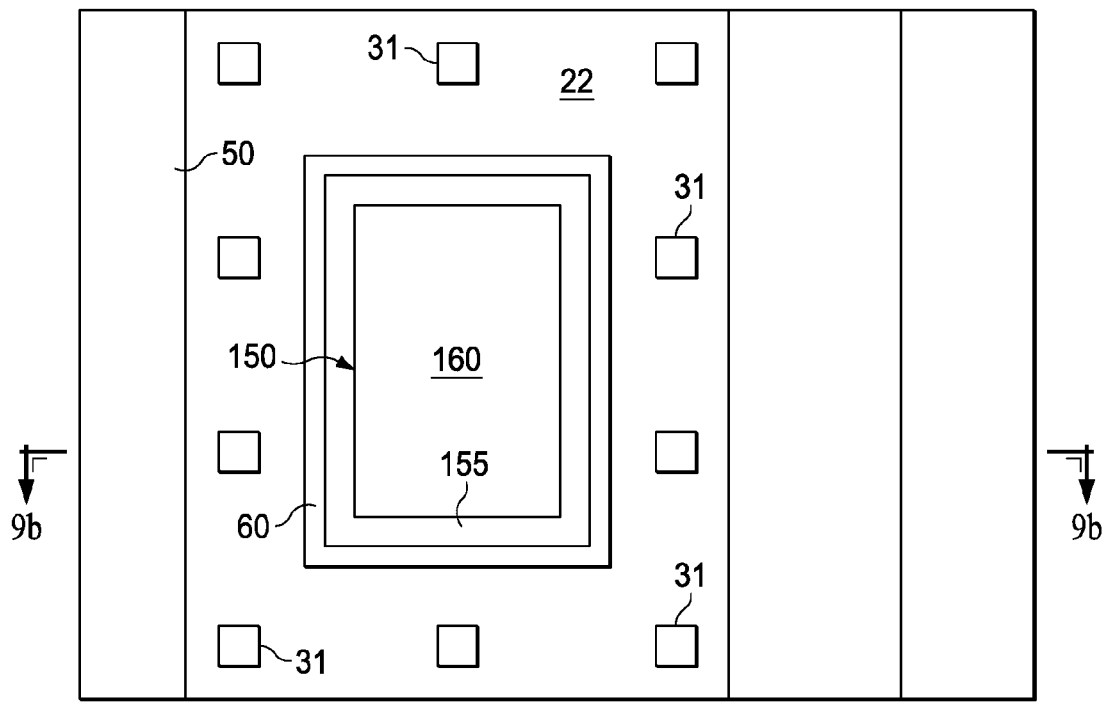
Figure 9B:
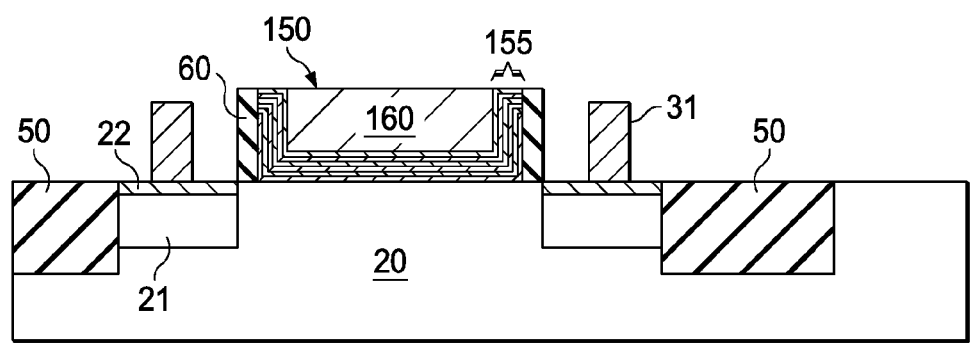

FIG. 9, which includes FIGS. 9a and 9b, illustrates a semiconductor diode in accordance with an alternative embodiment of the invention, wherein FIG. 9a illustrates a top view and FIG. 9b illustrates a cross-sectional view of the semiconductor device.

This embodiment is used to reduce the area of the diode as well as to improve the performance of a varactor formed using the Schottky diode. The resistances determining the Q factor of the varactor depend on the metal resistance, the contact resistances (e.g., second doped layer 21 and the silicide regions 22), the resistance of the heavily doped second doped layer 21, and the undepleted low-doped first doped layer 20 resistance. Clearly, the resistance of the low-doped first doped layer 20 is likely to be significant. Because the spacers 60 naturally prevent any shorting between the metal electrode 150 and the silicide regions 22, the second doped region 21 can be formed at the edge of the metal electrode 150 minimizing the resistance of the low-doped first doped layer 20. Thus, a high performance varactor with high quality (Q) factor can be produced using embodiments of the invention. For example, in one or more embodiments, the Q factor of the varactor is at least 100 at 2 GHz.

A varactor with high Q factor and large tuning range is a prerequisite for the design of a current efficient voltage-controlled oscillator (VCO), which is extensively used in CMOS integrated RF transceivers, for example, within the phase locked loop (PLL) circuit.

Further, embodiments of the invention may be used as flyback diode or free wheel diode because of the ability to have low forward voltage drop (~0.2 V) and the fast reverse voltage recovery.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a first doped region disposed in a first region of a substrate;
a first metal electrode disposed over and contacting the first doped region, the first metal electrode comprising a first portion of a metal layer;
a second doped region disposed in a second region of the substrate;
a dielectric layer disposed over the second doped region;
a second metal electrode disposed over the dielectric layer, the second metal electrode comprising a second portion of the metal layer, the second metal electrode being capacitively coupled to the second doped region;
a spacer disposed on a sidewall of the first metal electrode; and
a silicide region disposed in the first region, the spacer laterally separating the silicide region from the first metal electrode.

2. The device of claim 1, wherein the first metal electrode is surrounded by a first spacer, and wherein the second metal electrode is surrounded by a second spacer.

3. The device of claim 1, wherein the second metal electrode is a gate electrode of a transistor.

4. The device of claim 3, wherein the first region and the second region are part of a transistor, the second doped region is a channel region of the transistor, and the first doped region is a source/drain region of the transistor.

5. The device of claim 1, wherein the first doped region and the second doped region comprise opposite doping type.

6. The device of claim 1, wherein the metal layer comprises a material selected from the group consisting of aluminum nitride, hafnium nitride, tantalum nitride, titanium nitride, zirconium nitride, tungsten, tungsten nitride, molybdenum nitride, tantalum carbide, hafnium carbide, zirconium carbide, tantalum carbide nitride, and combinations thereof.

7. The device of claim 1, further comprising another metal layer disposed over the first and the second portions of the metal layer, wherein the other metal layer comprises a material selected from the group consisting of aluminum, tungsten, copper, titanium, nickel, platinum, palladium, titanium nitride, cobalt silicide, nickel silicide, and combinations thereof.

8. The device of claim 1, wherein the silicide region is formed as an annular region and at least partially surrounds the first doped region.

9. A semiconductor device comprising:
a first doped region disposed in a first region of a substrate;
a metal electrode disposed over and contacting the first doped region, wherein the metal electrode comprises a metal layer, and wherein the metal electrode is surrounded by a spacer; and
a silicide region disposed in the first region laterally proximate the first doped region, wherein the silicide region and the metal electrode do not overlap in a top view, and wherein the spacer laterally separates the silicide region from the metal electrode.

10. The device of claim 9, wherein the silicide region is formed as an annular region and at least partially surrounds the first doped region.

11. The device of claim 9, further comprising:
a second doped region disposed under the silicide region, the second doped region contacting the silicide region; and
a third doped region disposed under the spacer between the first and the second doped regions, the third doped region having a doping less than the second doped region.

12. The device of claim 9, further comprising:
a plurality of contacts disposed on the silicide region.

13. A transistor comprising:
a channel region of a first doping type disposed in a substrate;
a gate dielectric layer disposed over the channel region;
a gate electrode disposed over the gate dielectric layer;
a first source/drain region of a second doping type disposed in and/or over the substrate and coupled to the channel region, the second doping type being opposite to the first doping type;
a first contact electrode disposed over the first source/drain region, wherein the first contact electrode comprises a first portion of a metal layer, and the gate electrode comprises a second portion of the metal layer, and wherein the second portion of the metal layer contacts the first source/drain region;
a first spacer disposed over a sidewall of the gate electrode;
a second spacer disposed over a sidewall of the first contact electrode; and
a dielectric fill material disposed between the first spacer and the second spacer.

14. The transistor of claim 13, wherein the first portion of the metal layer contacts the gate dielectric layer.

15. The transistor of claim 13, further comprising:
a first source/drain extension region disposed in the substrate, wherein the first source/drain extension region is disposed between the first source/drain region and the channel region.

16. The transistor of claim 13, wherein a width of the gate electrode is larger than a width of the first contact electrode, the width being measured along a direction perpendicular to a direction from the first source/drain region to the channel region.

17. The transistor of claim 13, wherein the metal layer comprises a material selected from the group consisting of aluminum nitride, hafnium nitride, tantalum nitride, titanium nitride, zirconium nitride, tungsten, tungsten nitride, molybdenum nitride, tantalum carbide, hafnium carbide, zirconium carbide, tantalum carbide nitride, and combinations thereof.

18. The transistor of claim 13, further comprising another metal layer disposed over the first and the second portions of the metal layer, wherein the other metal layer comprises a material selected from the group consisting of aluminum, tungsten, copper, titanium, nickel, platinum, palladium, titanium nitride, cobalt silicide, nickel silicide, and combinations thereof.

19. A semiconductor device comprising:
a first doped region disposed in a first region of a substrate;
a metal electrode disposed over and physically contacting the first doped region, wherein the metal electrode and the first doped region are part of a metal-semiconductor junction, and wherein the metal electrode is surrounded by a spacer; and
a silicide region in the first region laterally proximate the first doped region, wherein the silicide region and the metal electrode do not overlap in a top view, and wherein the spacer laterally separates the silicide region from the metal electrode.

20. The device of claim 19, wherein the silicide region comprises an annular region and wherein the silicide region at least partially surrounds the first doped region.

21. The device of claim 19, further comprising:
a second doped region disposed under the silicide region, the second doped region contacting the silicide region; and
a third doped region disposed under the spacer between the first and the second doped regions, the third doped region having a doping less than the second doped region.

22. The device of claim 19, further comprising:
a plurality of contacts disposed on the silicide region.

* * * * *